United States Patent
Kang

(10) Patent No.: US 9,337,428 B2
(45) Date of Patent: May 10, 2016

(54) DONOR MASK AND METHOD OF MANUFACTURING ORGANIC LIGHT EMITTING DISPLAY APPARATUS USING THE SAME

(71) Applicant: Samsung Display Co., Ltd., Yongin (KR)

(72) Inventor: Tae-Wook Kang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/504,892

(22) Filed: Oct. 2, 2014

(65) Prior Publication Data
US 2015/0340615 A1    Nov. 26, 2015

(30) Foreign Application Priority Data

May 23, 2014    (KR) .................. 10-2014-0062590

(51) Int. Cl.
| | | |
|---|---|---|
| *H01L 51/00* | (2006.01) | |
| *H01L 51/56* | (2006.01) | |
| *H01L 51/52* | (2006.01) | |
| *B41M 5/382* | (2006.01) | |
| *H01L 27/32* | (2006.01) | |

(52) U.S. Cl.
CPC ............ *H01L 51/0013* (2013.01); *H01L 51/56* (2013.01); *B41M 5/382* (2013.01); *H01L 27/3211* (2013.01); *H01L 51/5271* (2013.01); *H01L 2251/558* (2013.01)

(58) Field of Classification Search
CPC .......................... H01L 51/0013; B41M 5/382
See application file for complete search history.

(56) References Cited

U.S. PATENT DOCUMENTS

| 7,648,944 B2 | 1/2010 | Matsuo et al. |
| 8,039,192 B2 | 10/2011 | Chung et al. |
| 8,093,612 B2 | 1/2012 | Tanaka |
| 8,129,004 B2 | 3/2012 | Matsuo |
| 8,153,201 B2 | 4/2012 | Aoyama et al. |
| 8,241,700 B2 | 8/2012 | Ikeda et al. |
| 2006/0243377 A1* | 11/2006 | Matsuo .................. B44C 1/17 156/235 |
| 2006/0246240 A1* | 11/2006 | Matsuda ............. H01L 51/0013 428/32.39 |
| 2008/0113292 A1* | 5/2008 | Matsuo ............... H01L 51/0013 430/270.1 |
| 2009/0221107 A1* | 9/2009 | Yamazaki ........... H01L 51/0013 438/29 |
| 2011/0195352 A1 | 8/2011 | Kim et al. |

FOREIGN PATENT DOCUMENTS

| JP | 2006-309994 | 11/2006 |
| JP | 2009-199856 | 9/2009 |
| JP | 5291607 | 6/2013 |
| KR | 10-2009-0114033 | 11/2009 |
| KR | 10-2010-0136728 | 12/2010 |
| KR | 10-2011-0093092 | 8/2011 |

* cited by examiner

*Primary Examiner* — Erik Kielin
(74) *Attorney, Agent, or Firm* — H.C. Park & Associates, PLC

(57) ABSTRACT

A method of manufacturing an organic light emitting display apparatus using a donor mask. The donor mask includes a base substrate, a light to heat conversion layer provided on the base substrate, and a reflection layer disposed between the base substrate and the light to heat conversion layer and comprising a through hole corresponding to a first transfer region, a non-transfer region having a first thickness and a second transfer region having a second thickness smaller than the first thickness, and the organic light emitting display apparatus using the same.

12 Claims, 10 Drawing Sheets

DONOR MASK AND METHOD OF MANUFACTURING ORGANIC LIGHT EMITTING DISPLAY APPARATUS USING THE SAME

CROSS-REFERENCE TO RELATED APPLICATION

This application claims priority from and the benefit of Korean Patent Application No. 10-2014-0062590, filed on May 23, 2014, which is hereby incorporated by reference for all purposes as if fully set forth herein.

BACKGROUND

1. Field

Exemplary embodiments relate to a donor mask and a method of manufacturing an organic light emitting display apparatus using the same, and more particularly, to a donor mask for dramatically increasing material usage efficiency and a method of manufacturing an organic light emitting display apparatus using the same.

2. Discussion of the Background

An organic light emitting display apparatus is a display apparatus including an organic-light emitting diode (OLED) in a display region, wherein the OLED includes a pixel electrode and an opposing electrode that face each other, and an intermediate layer disposed between the pixel and opposing electrodes and including an emission layer.

Various methods may be used to form the emission layer when manufacturing the organic light-emitting display apparatus, such as a deposition method, an inkjet printing method, etc.

However, a general method of manufacturing an organic light-emitting display apparatus has problems, such as a complex process of forming the emission layer and an excessive amount of materials used to form the emission layer.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a donor mask for dramatically increasing material usage efficiency and a method of manufacturing an organic light emitting display apparatus using the same.

Additional aspects will be set forth in the detailed description which follows, and, in part, will be apparent from the disclosure, or may be learned by practice of the inventive concept.

According to one or more embodiments of the present disclosure, a donor mask includes a base substrate, a light to heat conversion layer disposed on the base substrate; and a reflection layer disposed between the base substrate and the light to heat conversion layer and including a through hole, a non-transfer area having a first thickness, and a second transfer region having a second thickness smaller than the first thickness.

The donor mask may further include a transfer layer disposed on the light to heat conversion layer.

The donor mask may include a first alignment mark related to the through hole and a second alignment mark related to the second transfer region.

The greater a thickness of the reflection layer of the donor mask, the lower a light transmittance.

The reflection layer of the donor mask may include a third transfer region having a third thickness that is smaller than the first thickness and greater than the second thickness. The donor mask may include a first alignment mark related to the through hole, a second alignment mark related to the second transfer region, and a third alignment mark related to the third transfer region.

The reflection layer of the donor mask may have a single layer structure. The reflection layer of the donor mask may have a multilayer structure. The reflection layer of the donor mask may include a light blocking layer corresponding to the non-transfer region.

According to one or more embodiments of the present disclosure, a method of manufacturing an organic light-emitting display apparatus includes: preparing a first substrate on which a plurality of pixel electrodes are formed; preparing a second substrate on which a plurality of pixel electrodes are formed; preparing a donor mask including a base substrate, a light to heat conversion layer provided on the base substrate, and a reflection layer disposed between the base substrate and the light to heat conversion layer and including a through hole corresponding to a first transfer region, a non-transfer region having a first thickness, and a second transfer region having a second thickness smaller than the first thickness; depositing a transfer layer on the light to heat conversion layer of the donor mask; aligning the first substrate and the donor mask; transferring a part corresponding to the through hole of the transfer layer of the donor mask onto a part of the plurality of pixel electrodes on the first substrate; aligning of the first substrate and the donor mask; and transferring a part corresponding to the second transfer region of the transfer layer of the donor mask onto a part of the plurality of pixel electrodes on the second substrate.

The transfer layer may include an emission layer.

The donor mask may include a first alignment mark related to the through hole and a second alignment mark related to the second transfer region, wherein the aligning of the first substrate and the donor mask includes: using the first alignment mark of the donor mask, and wherein the aligning of the first substrate and the donor mask includes: using the second alignment mark of the donor mask.

The method may further include: re-depositing a transfer layer on the light to heat conversion layer of the donor mask.

The transferring of the part corresponding to the through hole and the transferring of the part corresponding to the second transfer region may include: irradiating a flash lamp or a laser beam onto the base substrate of the donor mask, and evaporating, vaporizing, or sublimating the part of the transfer layer where the flash lamp or laser beam is irradiated.

An intensity of the flash lamp or the laser beam in the transferring of the part corresponding to the second transfer region may be greater than that of the flash lamp or the laser beam in the transferring of the part corresponding to the through hole.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

These and/or other aspects will become apparent and more readily appreciated from the following description of the embodiments, taken in conjunction with the accompanying drawings in which.

DETAILED DESCRIPTION OF THE ILLUSTRATED EMBODIMENTS

Figure 1:
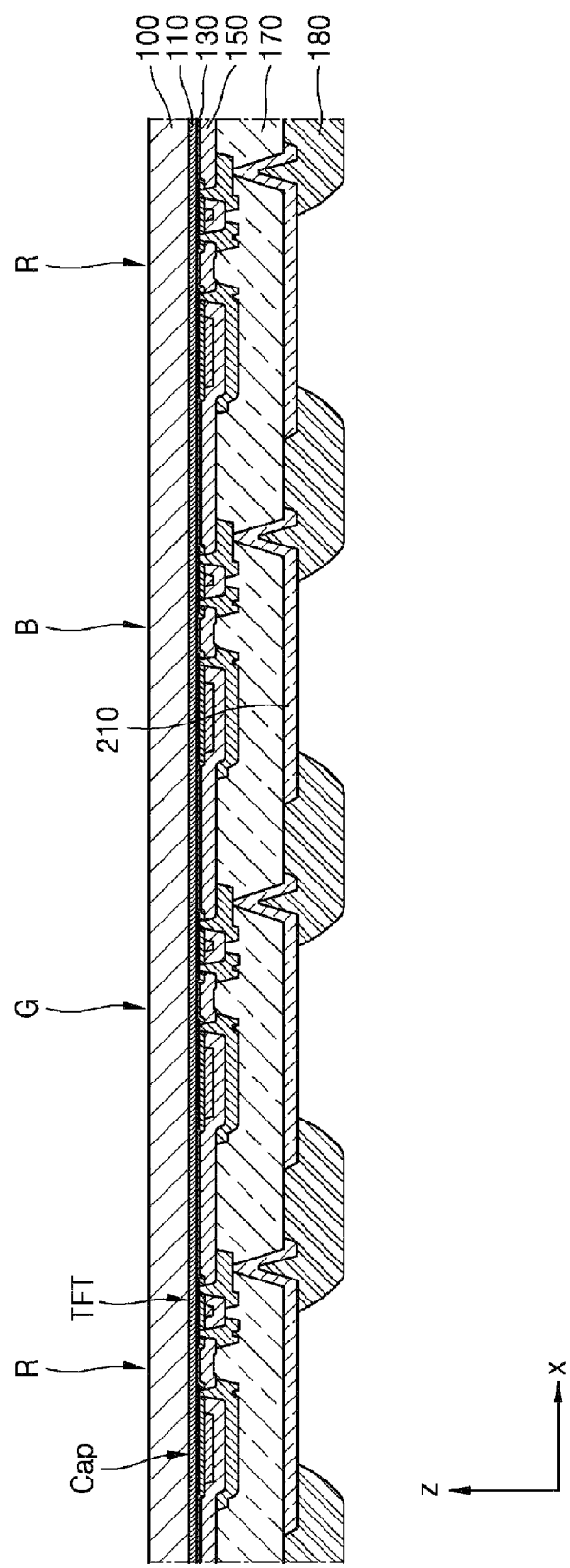
FIGS. 1 through 7 are schematic cross-sectional views for describing a method of manufacturing an organic light-emitting display apparatus, according to an embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIGS. 1 through 7 are schematic cross-sectional views for describing a method of manufacturing an organic light-emitting display apparatus, according to an embodiment of the present disclosure.

First, as shown in FIG. 1, a backplane is prepared. The backplane may at least include a first substrate 100, a pixel electrode 210 formed on the substrate 100, and a pixel-defining film 180 exposing at least a part of the pixel electrode 210 including a center portion thereof. The pixel-defining film 180 may protrude farther than the pixel electrode 210 with respect to the first substrate 100.

The pixel electrode 210 may be a (semi-)transparent electrode or a reflective electrode. When the pixel electrode 210 is the (semi-)transparent electrode, the pixel electrode 210 may be formed of indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 210 is the reflective electrode, the pixel electrode 210 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a film formed of ITO, IZO, ZnO, or $In_2O_3$. However, structures and materials of the pixel electrode 210 are not limited thereto and may vary.

The pixel-defining film 180 may include an opening corresponding to each subpixel, i.e., an opening exposing the center portion of the pixel electrode 210 or the entire pixel electrode 210 to define a pixel. Also, the pixel-defining film 180 may increase a distance between an end of the pixel electrode 210 and an opposing electrode (not shown) at a top portion of the pixel electrode 210 to prevent an arc from being generated at the end of the pixel electrode 210.

The backplane may further include other components if required. For example, as shown in FIG. 1, a thin-film transistor TFT or a capacitor Cap may be formed on the first substrate 100. Also, the backplane may further include other components, such as a buffer layer 110 preventing impurities from penetrating into a semiconductor layer of the thin-film transistor TFT, a gate insulation film 130 insulating the semiconductor layer of the thin-film transistor TFT and a gate electrode, an interlayer insulation film 150 for insulating source and drain electrodes of the thin-film transistor TFT and the gate electrode, and a planarization film 170 covering the thin-film transistor TFT and having an approximately flat top surface.

Figure 2:
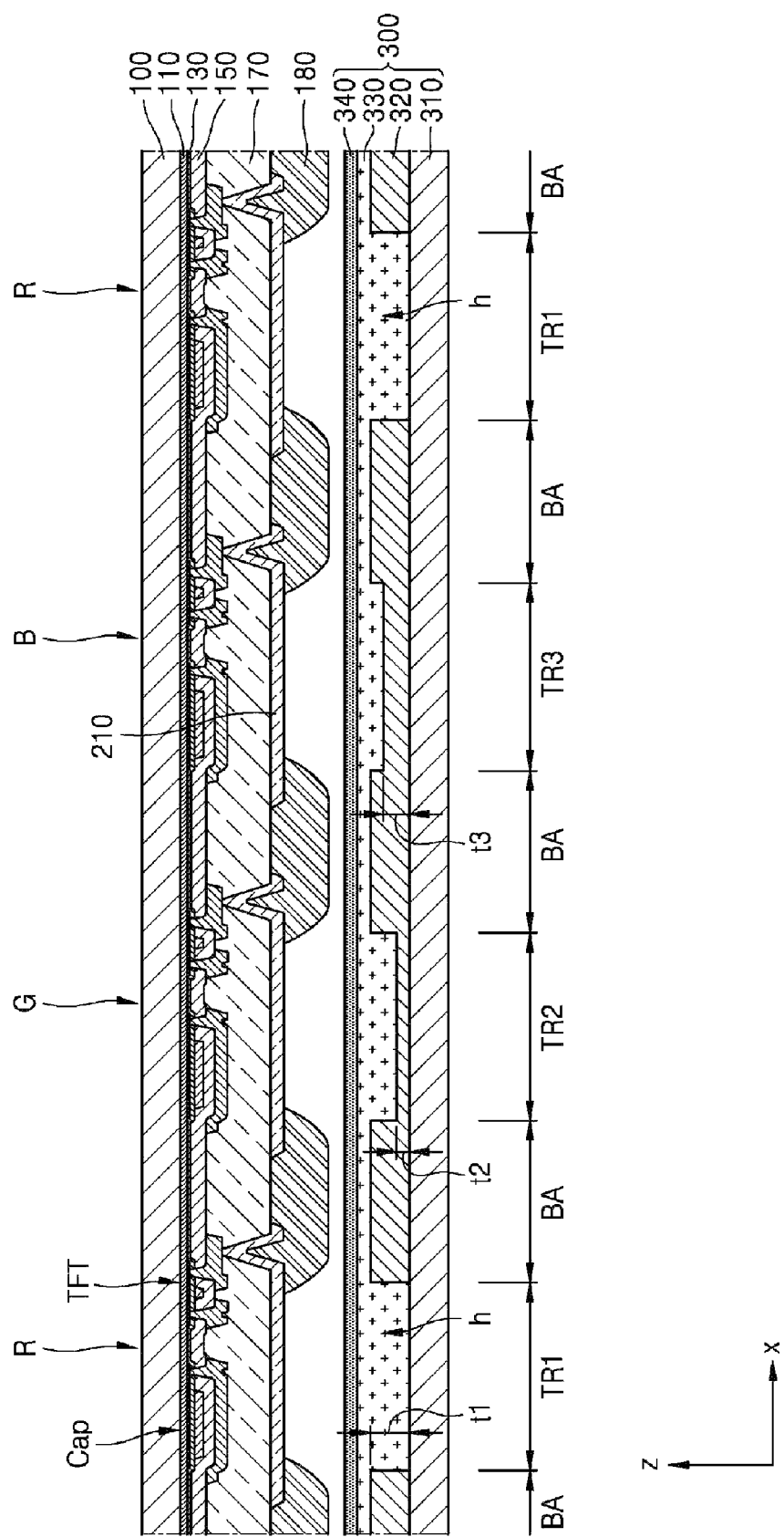

After preparing the backplane as described above, a donor mask 300 is provided to face the pixel electrode 210 and the pixel defining film 180 of the backplane as shown in FIG. 2. In more detail, as shown in FIGS. 1 and 2, the pixel electrode 210 and the pixel defining film 180 of the backplane are provided to face downward (−z direction), and the donor mask 300 is provided in a lower portion of the backplane. Before placing the backplane and the donor mask 300, a layer such as a hole injection layer or a hole transport layer may be previously formed on the pixel electrode 210 or on an entire surface of the first substrate 100.

The donor mask 300 may include a base substrate 310, a reflection layer 320, a light to heat conversion layer 330, and a transfer layer 340. In this regard, the transfer layer 340 is not a component of the donor mask 300 but may be merely formed on the donor mask 300. That is, a process of preparing the donor mask 300 and depositing the transfer layer 340 on the donor mask 300 may be used to manufacture the organic light-emitting display apparatus.

The base substrate 310 is configured to form a general outer shape of the donor mask 300, and may be formed of glass to transmit light to the light to heat conversion layer 330. Alternatively, the base substrate 310 may be formed of polyester such as polyethylene terephthalate (PET), polyacryl, polyepoxy, polyethylene and/or polystyrene.

The light to heat conversion layer 330 is a layer for absorbing flash lamp light or a laser beam when irradiated and converting at least a part of the energy of the absorbed flash lamp light or laser beam to heat. The light to heat conversion layer 330 may be a metal film formed of a metal such as aluminum or silver capable of absorbing light in an infrared light-visible light region, an oxide/sulfide film of such a metal, or an organic polymer film including carbon black or graphite.

The reflection layer 320 is disposed between the base substrate 310 and the light to heat conversion layer 330. The reflection layer 320 includes a through hole h, a non-transfer area BA having a first thickness t1, and a second transfer region TR2 having a second thickness t2 smaller than the first thickness t1. In this regard, the through hole h may be a first transfer region TR1 in the donor mask 300. As shown in FIG. 2, the reflection layer 320 may include a third transfer region TR3 having a third thickness t3 smaller than the first thickness t1 and greater than the second thickness t2.

The reflection layer 320 may be formed by using a halftone mask or forming a layer having a uniform thickness and removing a part of the layer on the base substrate 310. The reflection layer 320 may be formed of Ti, Al, Cu, Ag, Mo, an alloy of these, CrN, TiAlCu, etc. Alternatively, the reflection layer 320 may be formed of TiOx, SiOx, SiCN, etc.

The transfer layer 340 is a layer that may be evaporated, vaporized, or sublimated by heat generated in the light to heat conversion layer 330, and may, for example, include a luminous material. The transfer layer 340 may be a layer including a hole injection material, a layer including a hole transport material, a layer including a electron transport material, or a layer including an electron injection material if necessary.

When the backplane and the donor mask 300 are provided as shown in FIG. 2, it is necessary to exactly align the backplane and the donor mask 300. That is, it is necessary to exactly align the backplane and the donor mask 300 in order to enable the first transfer region TR1 of the donor mask 300 to correspond to a preset part of the backplane.

The transfer layer 340 of the donor mask 300 includes a luminous material that may emit red light in FIG. 2, and thus the backplane and the donor mask 300 are aligned so as to enable the through hole h of the reflection layer 320 that is the first transfer region TR1 of the donor mask 300 to correspond to the pixel electrode 210 of a red subpixel R. To this end, the backplane and the donor mask 300 may be configured to have an alignment key and a first alignment mark related to the through hole h. Accordingly, when the alignment key of the backplane and the first alignment mark of the donor mask 300 have a preset reciprocal location relationship, the through hole h of the reflection layer 320 that is the first transfer region TR1 of the donor mask 300 may correspond to the pixel electrode 210 of the red subpixel R.

Figure 3:
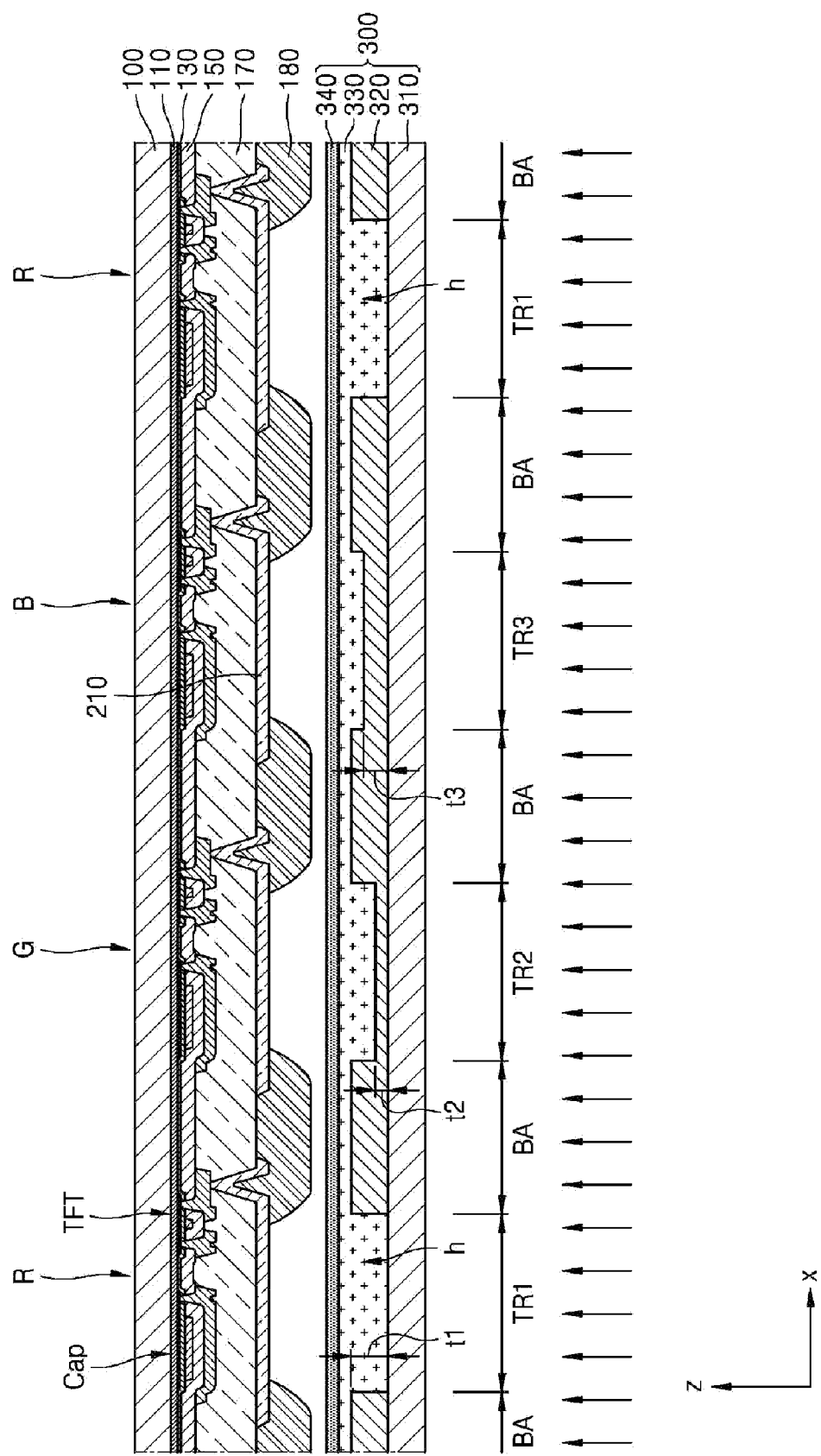

Thereafter, as shown in FIG. 3, lamp light or the laser beam (schematically indicated by the arrows) is irradiated onto the donor mask 300 at a preset first intensity or lower by using a flash lamp or a laser beam generator so that a part of the transfer layer 340 of the donor mask 300 is transferred to the backplane. In this regard, although the lamp light or the laser beam is irradiated onto the entire surface of the donor mask 300 by using the flash lamp or the laser beam generator, the lamp light or the laser beam is blocked by the reflection layer 320 for the most part and reaches the light to heat conversion layer 330 only in the first transfer region TR1 corresponding to the through hole h of the reflection layer 320. Accordingly, only the first transfer region TR1 in the transfer layer 340 of the donor mask 300 is evaporated, vaporized, or sublimated, and thus a red emission layer 220R is formed only in the pixel electrode 210 of the red subpixel R as shown in FIG. 4.

After the red emission layer 220R is formed as described above, the donor mask 300 may be exchanged to form a green emission layer or a blue emission layer on the pixel electrode 210 of a green subpixel G or a red subpixel B. If necessary, an electron injection layer, an electron transport layer, etc. are formed, and opposing electrodes corresponding to the red subpixel R, the green subpixel G, and the blue subpixel B are formed, thereby manufacturing the organic light-emitting display apparatus.

Figure 4:
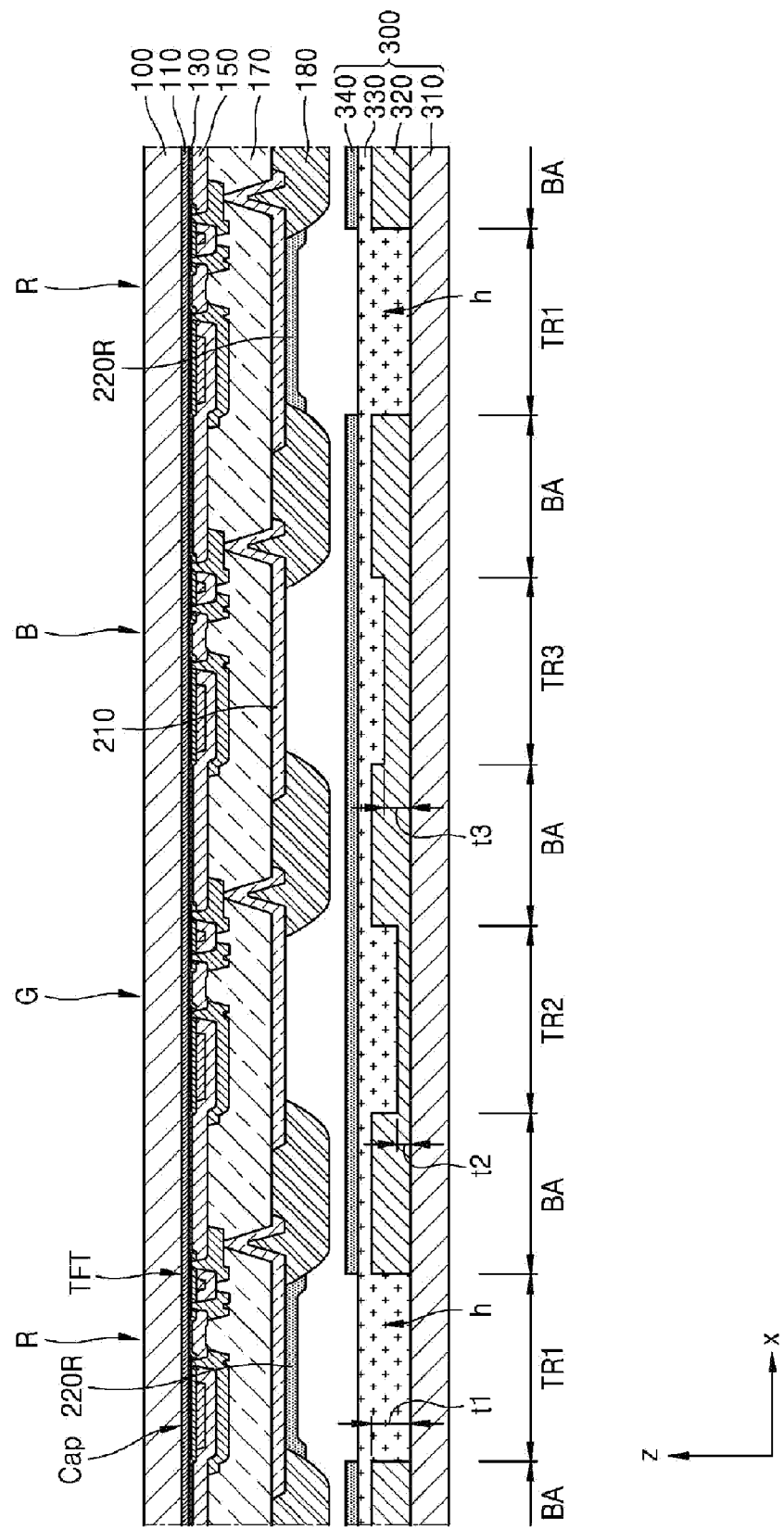
Figure 5:
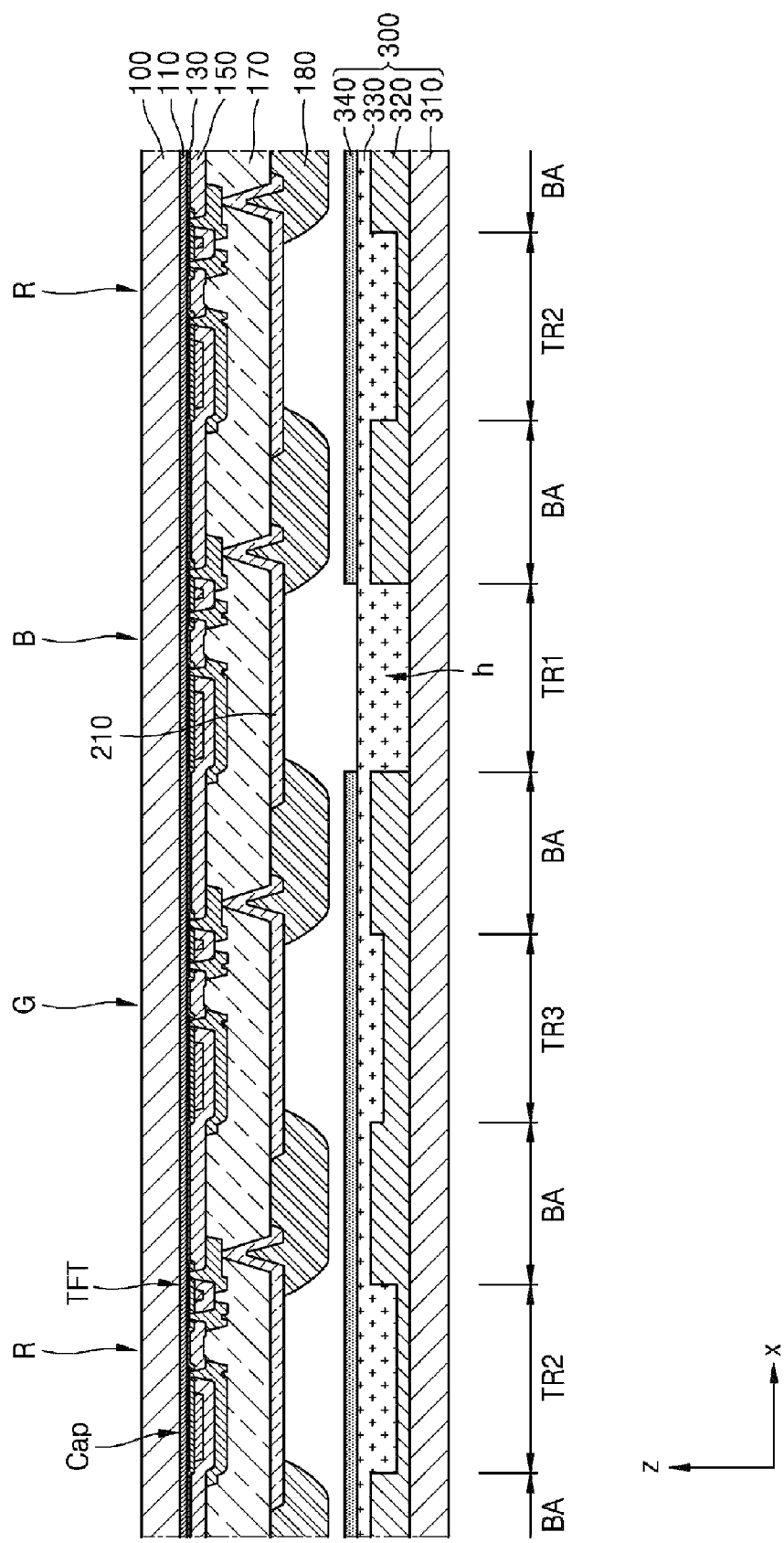

Meanwhile, as shown in FIG. 4, after the red emission layer 220R is formed, the donor mask 300 may be used to manufacture another organic light-emitting display apparatus. That is, as shown in FIG. 5, the donor mask 300 may be aligned in a new backplane (for forming the red emission layer 220R). The new backplane may be a second substrate on which a plurality of the pixel electrodes 210 is formed. In this regard, the transfer layer 340 is not present in the first transfer region TR1 of the donor mask 300, and thus it is necessary to align the new backplane and the donor mask 300 so as to enable the second transfer region TR2 of the donor mask 300 to correspond to a preset part of the new backplane.

The transfer layer 340 of the donor mask 300 includes the luminous material that may emit red light in FIG. 5, and thus the new backplane and the donor mask 300 are aligned so as to enable the second transfer region TR2 that is a part of the second thickness t2 of the reflection layer 320 of the donor mask 300 to correspond to the pixel electrode 210 of the red subpixel R. To this end, the donor mask 300 may be configured to have a second alignment mark related to the second transfer region TR2 that is a part of the second thickness t2 of the reflection layer 320, in addition to the first alignment key related to the through hole h as described above. Accordingly, when the alignment key of the new backplane (i.e., the second substrate) and the second align mark of the donor mask 300 have a preset reciprocal location relationship, the second transfer region TR2 that is the part of the second thickness t2 of the reflection layer 320 of the donor mask 300 may correspond to the pixel electrode 210 of the red subpixel R.

Figure 6:
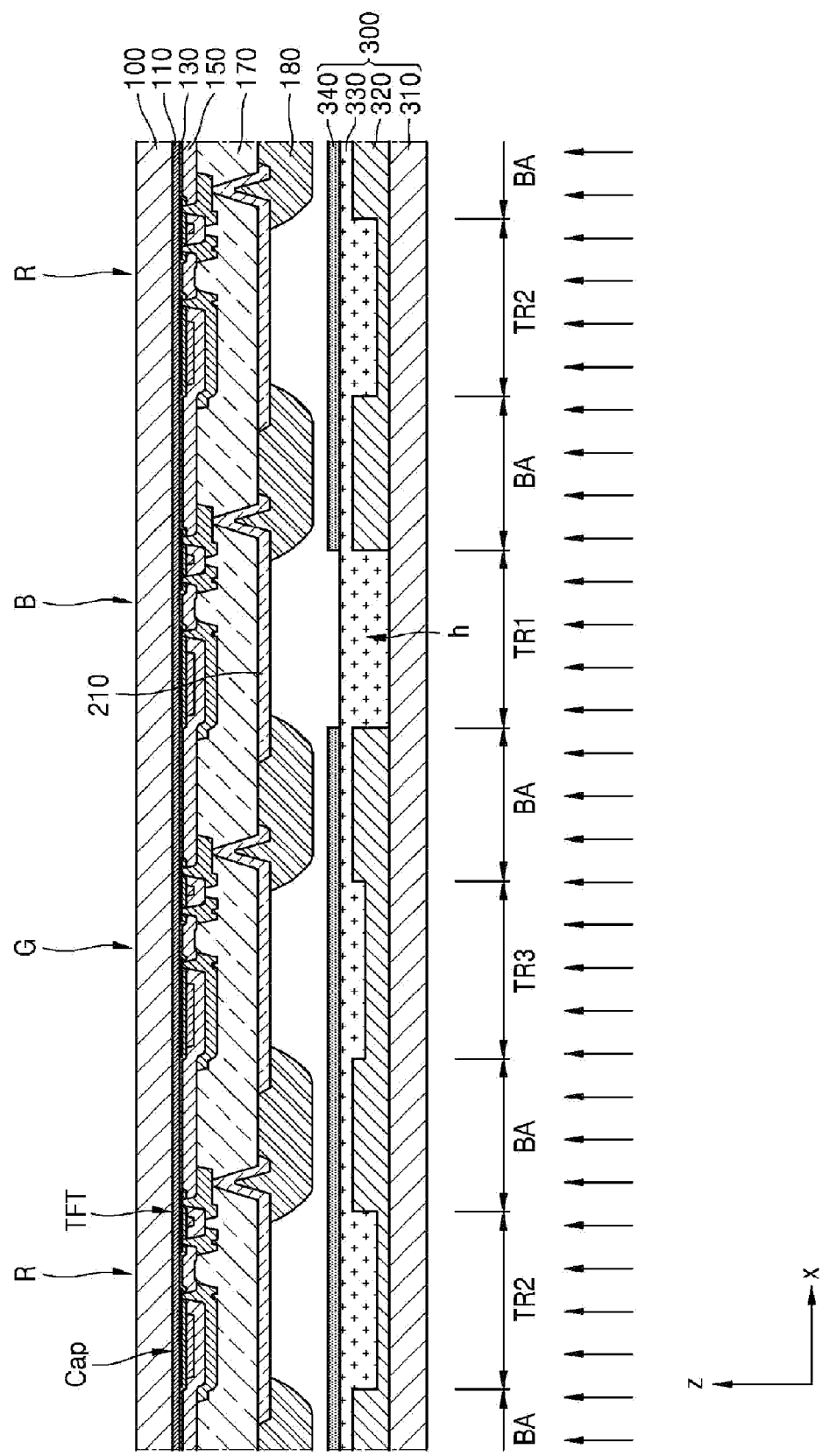

Thereafter, as shown in FIG. 6, the lamp light or the laser beam (indicated schematically by the arrows) is irradiated onto the donor mask 300 at a second intensity that is higher than the preset first intensity or lower than a preset third intensity by using the flash lamp or the laser beam generator so that a part of the transfer layer 340 of the donor mask 300 is transferred to the new backplane.

That is, if the lamp light or the laser beam is irradiated at an intensity lower than the preset first intensity, the lamp light or the laser beam may pass through only the through hole h of the reflection layer 320 and may mostly not pass through the reflection layer 320 itself. In this regard, if the lamp light or the laser beam is irradiated at the second intensity that is higher than the preset first intensity and lower than the preset third intensity, the lamp light or the laser beam may pass through the through hole h of the reflection layer 320 and a part of the reflection layer 320 having the smallest thickness (a thinnest part of the reflection layer 320), i.e. the second transfer region TR2 having the second thickness t2, and reach the light to heat conversion layer 330. Since the lamp light or the laser beam is irradiated at an intensity lower than the preset third intensity, the lamp light or the laser beam mostly does not pass through the reflection layer 320 other than the through hole h of the reflection layer 320 or the second transfer region TR2.

Figure 7:
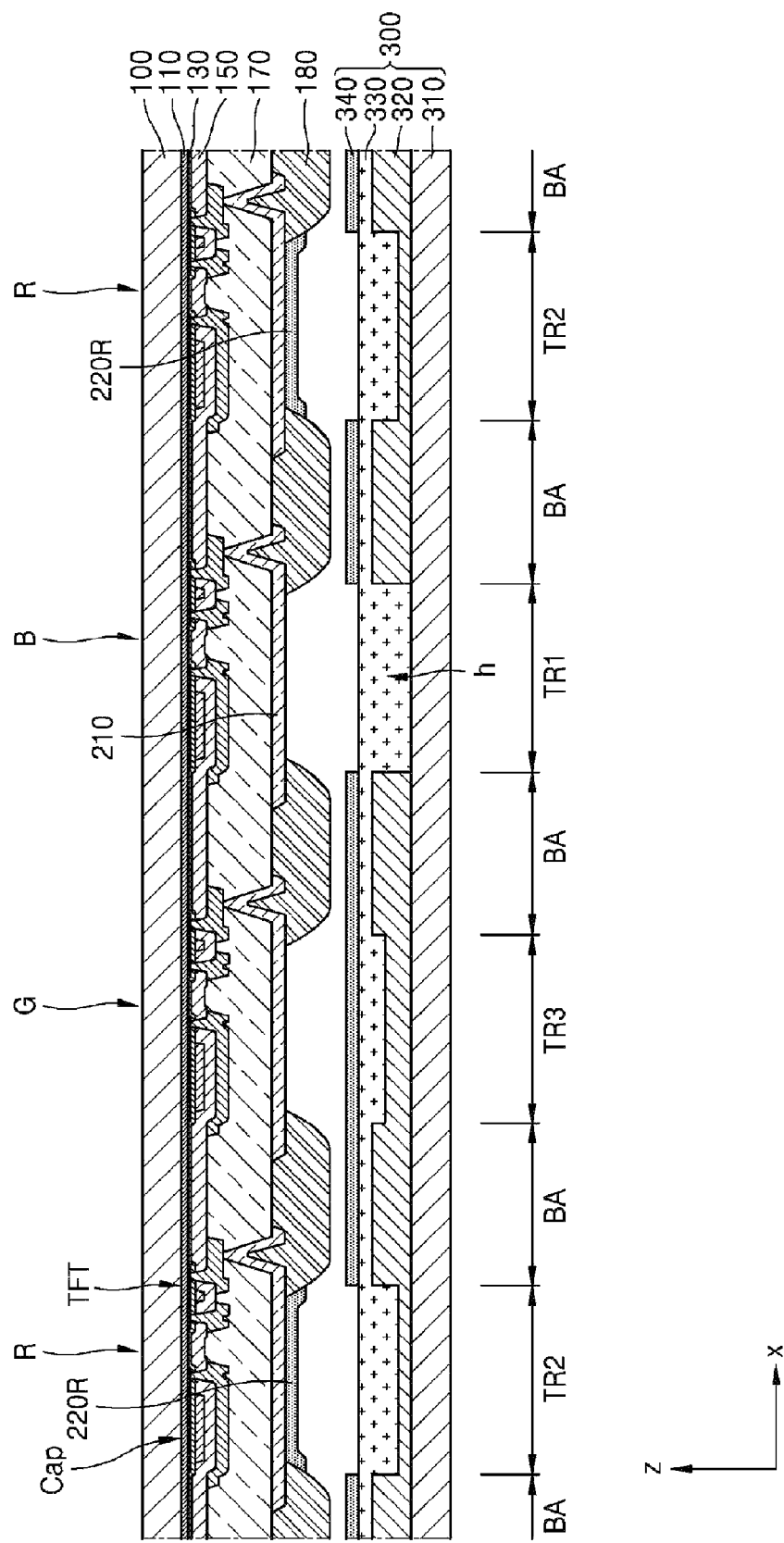

As described above, if the lamp light or the laser beam is irradiated at the second intensity that is higher than the preset first intensity or is lower than the preset third intensity, heat is generated in the light to heat conversion layer 330 so that a part of the transfer layer 340 corresponding to the second transfer region TR2 is evaporated, vaporized, or sublimated, and thus the red emission layer 220R is formed only in the pixel electrode 210 of the red subpixel R as shown in FIG. 7. Although the lamp light or the laser beam reaches the light to heat conversion layer 330 in the first transfer region TR1 of the donor mask 300, since the transfer layer 340 is not present in the first transfer region TR1, the red emission layer is not formed in the pixel electrode 210 of the blue subpixel B.

Meanwhile, as shown in FIG. 7, the donor mask 300 may be used to manufacture another organic light-emitting display apparatus.

That is, the donor mask 300 may be configured to have a third alignment mark related to the third transfer region TR3 that is the part of the reflection layer 320 having the third thickness t3, in addition to the first alignment key related to the through hole h or the second alignment mark related to the second transfer region TR2 that is the part of the reflection layer 320 having the second thickness t2 as described above. Accordingly, when an alignment key of a new backplane (i.e., a third substrate) and the third alignment mark of the donor mask 300 have a preset reciprocal location relationship, the part of the third thickness t3 of the reflection layer 320 that is the third transfer region TR3 of the donor mask 300 may correspond to the pixel electrode 210 of the red subpixel R.

Thereafter, the lamp light or the laser beam is irradiated onto the donor mask 300 at the preset third intensity or higher by using the flash lamp or the laser beam generator so that a part of the transfer layer 340 of the donor mask 300 is transferred to a new backplane.

That is, if the lamp light or the laser beam is irradiated at an intensity lower than the preset first intensity, the lamp light or the laser beam may pass through only the through hole h of the reflection layer 320 and may mostly not pass through the reflection layer 320 itself. If the lamp light or the laser beam is irradiated at the second intensity that is higher than the preset first intensity and lower than the preset third intensity, the lamp light or the laser beam may pass through the through hole h of the reflection layer 320 and the part of the reflection layer 320 having the smallest thickness (the thinnest part of the reflection layer 320), i.e. the second transfer region TR2 having the second thickness t2, and reach the light to heat conversion layer 330. The lamp light or the laser beam mostly does not pass through the reflection layer 320 in a part of the reflection layer 320 having the first thickness t1 that is greater than the third thickness t3.

As described above, if the lamp light or the laser beam is irradiated at the preset third intensity or higher, heat is generated in the light to heat conversion layer 330 so that a part of the transfer layer 340 corresponding to the third transfer region TR3 is evaporated, vaporized, or sublimated, and thus the red emission layer 220R is formed only in the pixel electrode 210 of the red subpixel R. Although the lamp light or the laser beam reaches the light to heat conversion layer 330 in the first transfer region TR1 or the second transfer region TR2 of the donor mask 300, since the transfer layer 340 is not present in the first transfer region TR1 or the second transfer region TR2, the red emission layer is not formed in the pixel electrode 210 of the blue subpixel B.

As described above, the method of manufacturing the organic light-emitting display apparatus of the present embodiment may dramatically increase material use efficiency. For example, if the reflection layer 320 includes a through hole while having a uniform thickness, after the red emission layer 220R is formed by transferring the transfer layer 340 on the pixel electrode 210 of the red subpixel R once as shown in FIG. 4, reuse is impossible, for example, a remaining part of the transfer layer 340 is discarded. However, according to the method of manufacturing the organic light-emitting display apparatus of the present embodiment, the reflection layer 320 includes parts having the first thickness t1 through third thickness t3 in addition to the through hole h, and thus the transfer layer 340 may be transferred to at least three backplanes. Thus, a part of the transfer layer 340 that is not transferred but remains is a part on the block area BA (the non-transfer area BA), thereby dramatically increasing the material use efficiency.

Meanwhile, a process of transferring the transfer layer 340 many times and then re-depositing the transfer layer 340 on the light to heat conversion layer 330 of the donor mask 300 may be used to form the red emission layer 220R on the pixel electrode 210 of the red subpixel R that is part of a new backplane.

The method of manufacturing the organic light-emitting display apparatus has been described hereinabove, but the present disclosure is not limited thereto. The donor mask 300 used in the method is also within the scope of the present disclosure.

The donor mask 300 according to an embodiment of the present disclosure may include the base substrate 310, the reflection layer 320, and the light to heat conversion layer 330 as shown in FIG. 2. The transfer layer 340 may be formed on the light to heat conversion layer 330 by using deposition.

The base substrate 310 is configured to form a general outer shape of the donor mask 300, and may be formed of glass to transmit light to the light to heat conversion layer 330. According to circumstances, the base substrate 310 may be formed of polyester such as PET, polyacryl, polyepoxy, polyethylene and/or polystyrene.

The light to heat conversion layer 330 is a layer for absorbing flash lamp light or a laser beam when irradiated and converting at least a part of energy of the absorbed flash lamp light or laser beam to heat. The light to heat conversion layer 330 may be a metal film formed of a metal such as aluminum or silver capable of absorbing light in an infrared light-visible light region, an oxide/sulfide film of such a metal, or an organic polymer film including carbon black or graphite.

The reflection layer 320 includes the through hole h, the non-transfer area BA having the first thickness t1, and the second transfer region TR2 having the second thickness t2 smaller than the first thickness t1. In this regard, the through hole h may be the first transfer region TR1 in the donor mask 300. As shown in FIG. 2, the reflection layer 320 may include the third transfer region TR3 having a third thickness t3 smaller than the first thickness t1 and greater than the second thickness t2.

The greater the thickness of the reflection layer 320, the lower the light transmittance. Accordingly, if lamp light or a laser beam is irradiated onto the donor mask 300 at a preset first intensity or lower by using a flash lamp or a laser beam generator, the lamp light or the laser beam is mostly blocked by the reflection layer 320 and reaches the light to heat conversion layer 330 only in the first transfer region TR1 corresponding to the through hole h of the reflection layer 320. If the lamp light or the laser beam is irradiated at a second intensity that is higher than the preset first intensity and lower than preset third intensity, the lamp light or the laser beam may pass through the through hole h of the reflection layer 320 and a part of the reflection layer 320 having the smallest thickness (a thinnest part of the reflection layer 320), i.e. the second transfer region TR2 having the second thickness t2, and reach the light to heat conversion layer 330. Since the lamp light or the laser beam is irradiated at an intensity lower than the preset third intensity, the lamp light or the laser beam mostly does not pass through the reflection layer 320 other than the through hole h of the reflection layer 320 or the second transfer region TR2. Furthermore, if the lamp light or the laser beam is irradiated onto the donor mask 300 at the preset third intensity or higher, the lamp light or the laser beam mostly does not pass through the reflection layer 320 in the block area BA (the non-transfer area BA) that is a part of the reflection layer 320 having the first thickness t1 that is greater than the third thickness t3.

The above-described donor mask 300 may include a first alignment mark related to the through hole h, a second alignment mark related to the second transfer region TR2, and a third alignment mark related to the third transfer region TR3.

Meanwhile, the reflection layer 320 may have a single layer structure as shown in FIG. 2 but the present disclosure is not limited thereto. That is, the reflection layer 320 may have a multilayer structure according to necessity.

Figure 8:
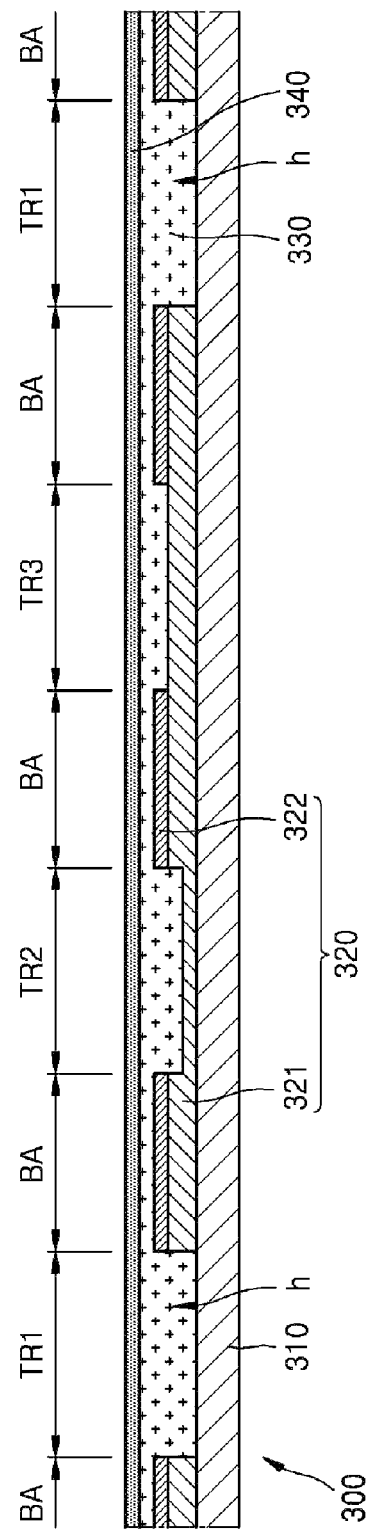
FIG. 8 is a schematic cross-sectional view of a donor mask according to an embodiment of the present disclosure.

For example, as shown in FIG. 8 that is a schematic cross-sectional view of the donor mask 300 according to an embodiment of the present disclosure, the reflection layer 320 may include a light blocking layer 322 corresponding to the non-transfer area BA. A semi-transmittance layer 321 that is a remaining part of the reflection layer 320 may include the through hole h, the second transfer region TR2 having the second thickness t2, and the third transfer region TR3 having the third thickness t3. The semi-transmittance layer 321 is also present in the non-transfer area BA and thus may be present in a lower portion of the light blocking layer 322. When the transfer layer 340 of the first transfer region TR1, the second transfer region TR2, and/or the third transfer region TR3 is transferred, the light blocking layer 322 may originally block lamp light or a laser beam from reaching the light to heat conversion layer 330 in the non-transfer area BA. The light blocking layer 322 may include metal having excellent light blocking performance or a black matrix material.

Figure 9:
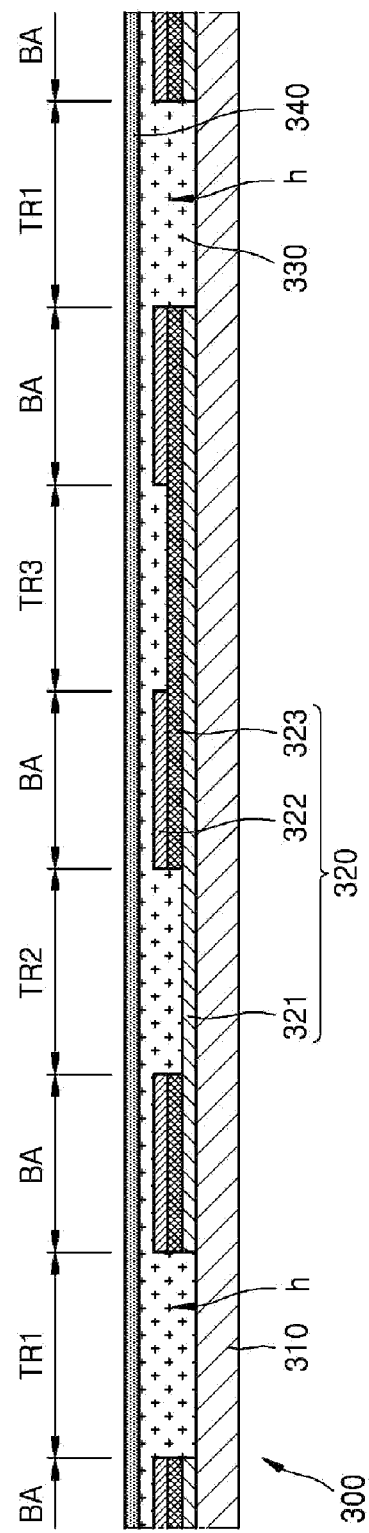
FIG. 9 is a schematic cross-sectional view of a donor mask according to another embodiment of the present disclosure.

FIG. 9 is a schematic cross-sectional view of the donor mask 300 according to another embodiment of the present disclosure. In the donor mask 300 according to the present embodiment, the reflection layer 320 has a multilayer structure including a first semi-transmittance layer 321 and a second semi-transmittance layer 323 in addition to the light blocking layer 322. Accordingly, a part of the donor mask 300 in which both the first semi-transmittance layer 321 and the second semi-transmittance layer 323 include the through hole h is the through hole h of the reflection layer 320 that forms the first transfer region TR1, a part of the donor mask 300 only including the first semi-transmittance layer 321 forms the second transfer region TR2, a part of the donor mask 300 in which both the first semi-transmittance layer 321 and the second semi-transmittance layer 323 are present as a layered structure forms the third transfer layer TR3, and a part of the donor mask 300 in which the first semi-transmittance layer 321, the second semi-transmittance layer 323, and the light block layer 322 are present forms the non-transfer area BA.

Figure 10:
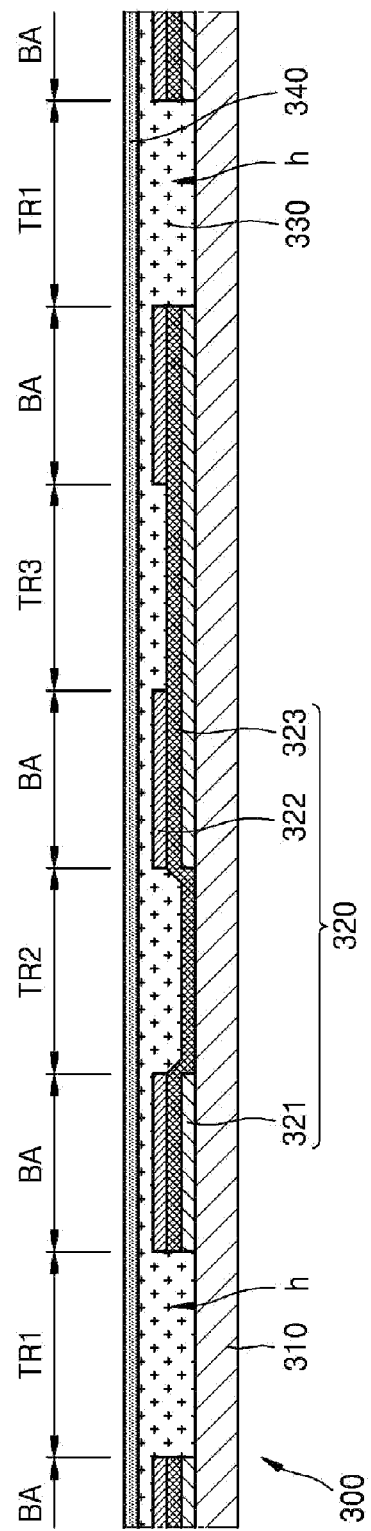
FIG. 10 is a schematic cross-sectional view of a donor mask according to another embodiment of the present disclosure.

An area of the first semi-transmittance layer 321 is greater than that of the second semi-transmittance layer 323 in FIG. 9 but the present disclosure is not limited thereto. For example, as shown in FIG. 10, the area of the second semi-transmittance layer 323 is greater than that of the first semi-transmittance layer 321 so that a part of the second semi-transmittance layer 323 may directly contact the base substrate 310. In this case, the part of the donor mask 300 in which both the first semi-transmittance layer 321 and the second semi-transmittance layer 323 include the through hole h is the through hole h of the reflection layer 320 and forms the first transfer region TR1, the part of the donor mask 300 only including the first semi-transmittance layer 321 forms the second transfer region TR2, the part of the donor mask 300 in which the first semi-transmittance layer 321 and the second semi-transmittance layer 323 are present as the layered structure forms the third transfer layer TR3, and the part of the reflection layer 320 in which the first semi-transmittance layer 321, the second semi-transmittance layer 323, and the light blocking layer 322 are present forms the non-transfer area BA.

The reflection layer 320 may have a different structure, for example, a multilayer structure of a metal layer and an inorganic layer or a multilayer structure of only the inorganic layer.

The method of manufacturing the organic light-emitting display apparatus described above may also use the donor mask 300 as shown in one of FIGS. 8 through 10 or the modified donor mask 300.

As described above, according to the one or more of the above embodiments of the present disclosure, a donor mask for dramatically increasing material use efficiency and a method of manufacturing an organic light emitting display apparatus using the same may be implemented. However, the scope of the present disclosure is not limited by such an effect.

It should be understood that the exemplary embodiments described herein should be considered in a descriptive sense only and not for purposes of limitation. Descriptions of features or aspects within each embodiment should typically be considered as available for other similar features or aspects in other embodiments.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing an organic light-emitting display apparatus, the method comprising:
    preparing a first substrate comprising a plurality of pixel electrodes;
    preparing a second substrate comprising a plurality of pixel electrodes;
    preparing a donor mask comprising a base substrate, a light to heat conversion layer disposed on the base substrate, a reflection layer disposed between the base substrate and the light to heat conversion layer and comprising a through hole corresponding to a first transfer region, a non-transfer region having a first reflection layer thickness, and a second transfer region having a second reflection layer thickness smaller than the first thickness;
    depositing a transfer layer on the light to heat conversion layer of the donor mask;
    aligning the first substrate and the donor mask;
    transferring a portion of the transfer layer corresponding to the through hole of the reflection layer of the donor mask onto a part of the plurality of pixel electrodes on the first substrate;
    aligning the second substrate and the donor mask; and
    transferring a portion of the transfer layer corresponding to the second transfer region of the transfer layer of the donor mask onto a part of the plurality of pixel electrodes on the second substrate.

2. The method of claim 1, wherein the transfer layer comprises an emission layer.

3. The method of claim 1, wherein the donor mask comprises a first alignment mark related to the through hole and a second alignment mark related to the second transfer region,
    wherein the aligning of the first substrate and the donor mask comprises: using the first alignment mark of the donor mask, and
    wherein the aligning of the first substrate and the donor mask comprises: using the second alignment mark of the donor mask.

4. The method of claim 1, further comprising: re-depositing a transfer layer on the light to heat conversion layer of the donor mask.

5. The method of claim 1, wherein the transferring of the portion of the transfer layer corresponding to the through hole and the transferring of the portion of the transfer layer corresponding to the second transfer region comprise: irradiating a flash lamp or a laser beam onto the base substrate of the donor mask, and evaporating, vaporizing, or sublimating a part of the transfer layer where the flash lamp or laser beam is irradiated.

6. The method of claim 5, wherein an intensity of the flash lamp or the laser beam in the transferring of the portion of the transfer layer corresponding to the second transfer region is greater than that of the flash lamp or the laser beam in the transferring of the portion of the transfer layer corresponding to the through hole.

7. The method of claim 1, wherein the greater a thickness of the reflection layer of the donor mask, the lower a light transmittance.

8. The method of claim 1, wherein the reflection layer of the donor mask comprises a third transfer region having a third thickness that is smaller than the first thickness and greater than the second thickness.

9. The method of claim 8, wherein the donor mask comprises a first alignment mark related to the through hole, a second alignment mark related to the second transfer region, and a third alignment mark related to the third transfer region,
    wherein the aligning of the first substrate and the donor mask comprises: using the first alignment mark of the donor mask, and
    wherein the aligning of the first substrate and the donor mask comprises: using the second alignment mark of the donor mask,
    further comprising:
    aligning a third substrate and the donor mask by using the third alignment mark; and
    transferring a portion of the transfer layer corresponding to the third transfer region of the transfer layer of the donor mask onto a part of a plurality of pixel electrodes on the third substrate.

10. The method of claim 1, wherein the reflection layer of the donor mask has a single layer structure.

11. The method of claim 1, wherein the reflection layer of the donor mask has a multilayer structure.

12. The method of claim 11, wherein the reflection layer of the donor mask comprises a light blocking layer corresponding to the non-transfer region.

* * * * *